(12) United States Patent
Chiu

(10) Patent No.: US 6,506,626 B1
(45) Date of Patent: Jan. 14, 2003

(54) SEMICONDUCTOR PACKAGE STRUCTURE WITH HEAT-DISSIPATION STIFFENER AND METHOD OF FABRICATING THE SAME

(75) Inventor: Shih-Kuang Chiu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/629,068

(22) Filed: Jul. 29, 2000

(30) Foreign Application Priority Data

May 12, 2000 (TW) .................................. 89109082 A

(51) Int. Cl.$^7$ ..................... H01L 21/44; H01L 21/48; H01L 21/50
(52) U.S. Cl. ....................................... 438/108; 438/613
(58) Field of Search ........................... 438/108, 613–617

(56) References Cited

U.S. PATENT DOCUMENTS

| | | | | |
|---|---|---|---|---|
| 5,585,671 A | * | 12/1996 | Nagesh et al. | 257/697 |
| 5,835,355 A | * | 11/1998 | Dordi | 174/252 |
| 5,889,321 A | * | 3/1999 | Culnane et al. | 257/701 |
| 6,020,221 A | | 2/2000 | Lim et al. | |
| 6,100,108 A | * | 8/2000 | Mizuno et al. | 438/115 |
| 6,294,408 B1 | * | 9/2001 | Edwards et al. | 438/108 |
| 6,294,831 B1 | * | 9/2001 | Shishido et al. | 257/687 |
| 6,309,908 B1 | * | 10/2001 | Sarihan et al. | 438/106 |
| 6,313,521 B1 | * | 11/2001 | Baba | 257/659 |
| 6,335,563 B1 | * | 1/2002 | Hashimoto | 257/632 |
| 6,410,981 B2 | * | 6/2002 | Tao | 257/704 |
| 2001/0013640 A1 | * | 8/2001 | Tao | 257/667 |

FOREIGN PATENT DOCUMENTS

JP 11126835 * 5/1995

* cited by examiner

*Primary Examiner*—David E. Graybill
(74) *Attorney, Agent, or Firm*—Peter F. Corless; Steven M. Jensen; Edwards & Angell, LLP

(57) ABSTRACT

A semiconductor package structure with a heat-dissipation stiffener and a method of fabricating the same are proposed. The proposed packaging technology includes a substrate; a thermally-conductive stiffener mounted over the front surface of the substrate, the stiffener being formed with a centrally-hollowed portion and an outward-extending passage a semiconductor chip mounted on the front surface of the substrate and within the centrally-hollowed portion of the stiffener; an underfill layer filled and cured in a gap between the semiconductor chip and the substrate; and a plurality of solder balls mounted on the back surface of the substrate. Alternatively, the passage can be formed in the front surface of the substrate. During fabrication process, the passage is used for the injection of a cleaning solvent into the gap between the semiconductor chip and the substrate so as to clean away remnant solder flux. The proposed packaging technology allows the cleaning solvent used in the solder flux cleaning process to be unobstructed by the stiffener so that the cleaning solvent can be more smoothly injected into the gap between the semiconductor chip and the substrate. This benefit allows the subsequently formed underfill layer to be substantially free of voids, allowing the finished package product to be more assured in quality and reliability.

7 Claims, 4 Drawing Sheets

SEMICONDUCTOR PACKAGE STRUCTURE WITH HEAT-DISSIPATION STIFFENER AND METHOD OF FABRICATING THE SAME

BACKGROUND OF THE INVENTION

1. Field of the Invention

This invention relates to semiconductor packaging technology, and more particularly, to a semiconductor package structure with a heat-dissipation stiffener and a method of fabricating the same, which allow the finished package product to be more assured in quality and reliability.

2. Description of Related Art

In BGA (Ball Grid Array, BGA) technology, flip-chip bonding is an essential fabrication process including a first step of bonding the semiconductor chip over the substrate by means of solder balls; a second step of injecting a cleaning solvent into the gap between the chip and the substrate to wash away the remnant flux therein; a third step of performing an underfill process; a fourth step of performing ball-mounting process to mount solder balls on the back surface of the substrate; and a fifth step of performing a singulation process to cut apart the package body into separate package units.

One drawback to the forgoing process, however, is that, since the semiconductor chip is different in coefficient of thermal expansion (CTE) from the substrate, the entire package structure would be easily subjected to warpage after undergoing high-temperature conditions during die bonding, flip-chip underfill, and ball mounting processes, which would easily cause chip cracking, making the resulted package product degraded in quality and reliability. When flex or thin substrate is used as the base, the package warpage would be even more worse.

One solution to the foregoing problem is disclosed in U.S. Pat. No. 6,020,221, which teaches the use of a stiffener to help prevent package warpage, whose package structure is briefly described in the following with reference to FIGS. 1–2. As shown, the patented package structure 10 includes a substrate 14; a semiconductor chip 12 bonded to the substrate 14 by means of solder balls 30; a stiffener 20 having a centrally-hollowed portion 24 and adhered to the substrate 14 by means of an adhesive 46; an underfill layer 32 filled and cured in the gap between the semiconductor chip 12 and the substrate 14; and a plurality of solder balls implanted on the back surface of the substrate 14. When the stiffener 20 is mounted in position, the semiconductor chip 12 is accommodated within the centrally-hollowed portion 24 thereof, so that the stiffener 20 can be easily integrated to the package structure.

Due to the provision of the stiffener 20 which is highly rigid in material quality, the foregoing package structure would be less likely subjected to package warpage. One draw. back to the forgoing package structure, however, is that when a cleaning solvent is injected to the gap between the semiconductor chip 12 and the substrate 14 to clean away remnant solder flux, the cleaning solvent would be partly obstructed by the stiffener 20, making the cleaning process very difficult to carry out efficiently and thoroughly. When some solder flux is still left, it would cause the subsequently formed flip-chip underfill layer to have voids, which would considerably degrade the quality and reliability of the finished package product.

SUMMARY OF THE INVENTION

It is therefore an objective of this invention to provide a new semiconductor packaging technology that allows the cleaning solvent used to clean away remnant solder flux to be smoothly injected to the gap between the chip and the substrate, so as to allow subsequently formed flip-chip underfill layer to be substantially free of voids, so that the quality and reliability of the finished package product can be more assured.

In accordance with the foregoing and other objectives, the invention proposes a new semiconductor packaging technology. The package structure of the invention includes a substrate having a front surface and a back surface; a thermally-conductive stiffener mounted over the front surface of the substrate, the stiffener being formed with a centrally-hollowed portion and an outward-extending passage; a semiconductor chip mounted on the front surface of the substrate and within the centrally-hollowed portion of the stiffener; an underfill layer filled and cured in a gap between the semiconductor chip and the substrate; and a plurality of solder balls mounted on the back surface of the substrate. Alternatively, the passage can be formed in the front surface of the substrate. During fabrication process, the passage is used for the injection of a cleaning solvent into the gap between the semiconductor chip and the substrate so as to clean away remnant solder flux. The cleaning effect can be more enhanced by using, for example, centrifugal, rotating, or disturbing type of flow accelerating means to help increase the flow speed of the injected solvent.

The invention allows the cleaning solvent used in the solder flux cleaning process to be unobstructed by the stiffener so that the cleaning solvent can be more smoothly injected into the gap between the semiconductor chip and the substrate. This benefit allows the subsequently formed underfill layer to be substantially free of voids; and therefore, the finished package product is more assured in quality and reliability.

DETAILED DESCRIPTION OF PREFERRED EMBODIMENTS

First Preferred Embodiment

Figure 1:
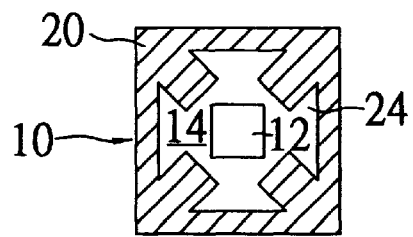
FIG. 1 (PRIOR ART) is a schematic top view of the semiconductor package structure disclose in U.S. Pat. No. 6,020,221.
Figure 2:
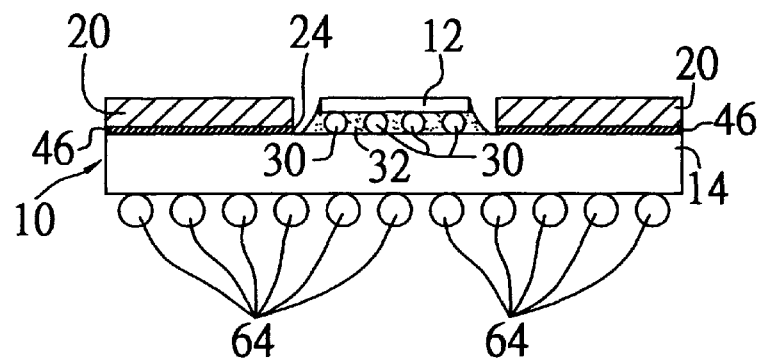
FIG. 2 (PRIOR ART) is a schematic sectional diagram of the semiconductor package structure FIG. 1.
Figure 3:
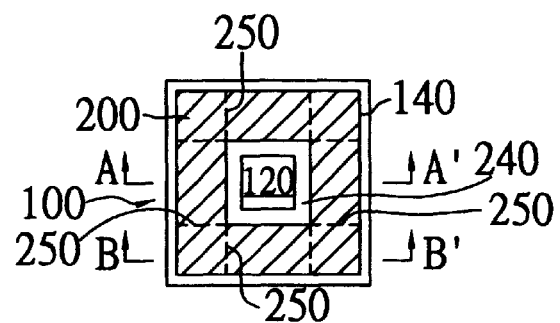
FIG. 3 is a schematic top view of a first preferred embodiment of the semiconductor package structure the invention.
Figure 4:
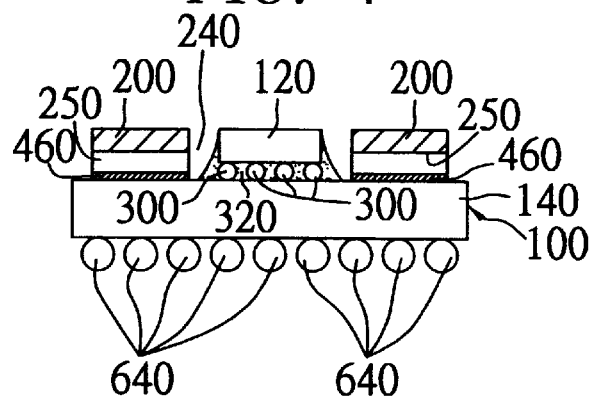
FIG. 4 is a schematic sectional diagram of the semiconductor package structure of FIG. 3 cutting through the line AA'.
Figure 5:
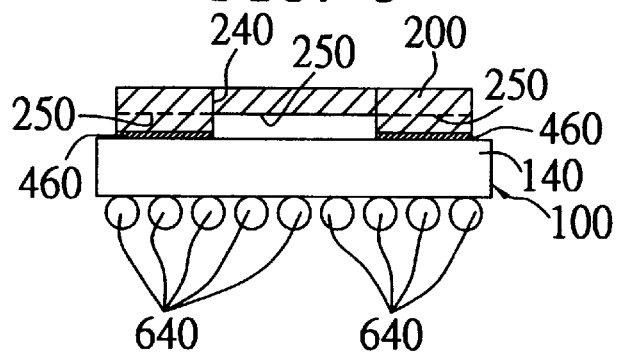
FIG. 5 is a schematic sectional diagram of the semiconductor package structure of FIG. 3 cutting through the line BB'.

The first preferred embodiment of the invention is disclosed in full details in the following with reference to FIGS. 3, 4, and 5.

As shown, the first embodiment of the semiconductor package structure of the invention 100 includes a substrate 140; a stiffener 200 having a centrally-hollowed portion 240 and adhered to the front surface of the substrate 140 by means of an adhesive 460; a semiconductor chip 120 bonded to the front surface of the substrate 140 by means of solder balls 300 and accommodated within the centrally-hollowed portion 240 of the stiffener 200; an underfill layer 320 filled and cured in the gap between the semiconductor chip 120 and the substrate 140; and a plurality of solder balls 640 mounted on the back surface of the substrate 140. The stiffener 200 is dimensioned substantially identically to the substrate 140. Further, the stiffener 200 is formed with at least one passage 250 extending outwards from the centrally-hollowed portion 240, which allows the cleaning solvent used in subsequent cleaning process to flow smoothly into the gap between the semiconductor chip 120 and the substrate 140 to clean away remnant solder flux. Moreover, the stiffener 200 should be made of a material that is rigid enough to prevent package warpage, substantially equal in CTE to the substrate 140, and thermally conductive to provide high heat-dissipation efficiency.

In the fabrication process, after the stiffener 200 is assembled in position, the semiconductor chip 120 can be then mounted through the centrally-hollowed portion 240 of the stiffener 200 onto the front surface of the substrate 140. The stiffener 200 can then serve both as strengthening means and heat-dissipation means to the package structure. After this, a cleaning solvent is injected through the passage 250 into the gap between the semiconductor chip 120 and the substrate 140 for the purpose of cleaning away remnant solder flux in the gap. Next, a flip-chip underfill process is performed to form an underfill layer 320 in the gap between the semiconductor chip 120 and the substrate 140. After this, a plurality of solder balls 640 are implanted on the back surface of the substrate 140. Finally, a singulation process is performed to provide the intended package product.

It can be learned from the foregoing description that the semiconductor package structure of the invention allows the cleaning solvent used in the solder flux cleaning process to be unobstructed by the stiffener 200 so that the cleaning solvent can be more smoothly injected into the gap between the semiconductor chip 120 and the substrate 140. This benefit allows the subsequently formed underfill layer 320 to be substantially free of voids; and therefore, the finished package product is more assured in quality and reliability. The cleaning effect can be more enhanced by using, for example, centrifugal, rotating, or disturbing type of flow accelerating means to help increase the flow speed of the injected solvent.

Second Preferred Embodiment

Figure 6:
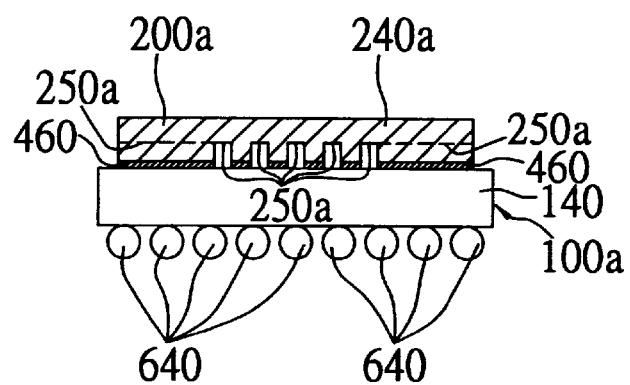
FIG. 6 is a schematic sectional diagram of a second preferred embodiment of the semiconductor package structure of the invention.

FIG. 6 is a schematic sectional diagram of the second preferred embodiment of the semiconductor package structure of the invention. As shown, this embodiment differs from the previous one only in that this embodiment includes a plurality of passages 250a. This allows an increase in the contact area between the stiffener 200a and the substrate 140, and thus an increase in the strengthening effect and heat-dissipation efficiency by the stiffener 200a.

Third Preferred Embodiment

Figure 7:
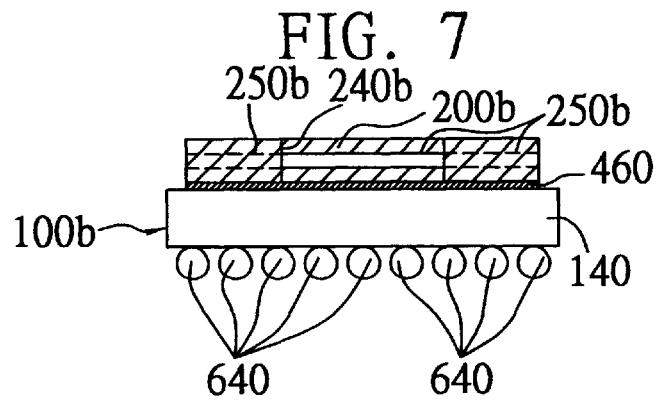
FIG. 7 is a schematic sectional diagram of a third preferred embodiment of the semiconductor package structure of the invention.

FIG. 7 is a schematic sectional diagram of the third preferred embodiment of the semiconductor package structure of the invention. As shown, this embodiment is characterized in that the passage 250b in the stiffener 200b is formed in the center of the stiffener 200b. This allows the stiffener 200b to use its full bottom surface for contact with the substrate 140, so that the overall contact area between the stiffener 200b and the substrate 140 can be increased, thereby resulting in an increased strengthening effect and heat-dissipation efficiency.

Fourth Preferred Embodiment

Figure 8:
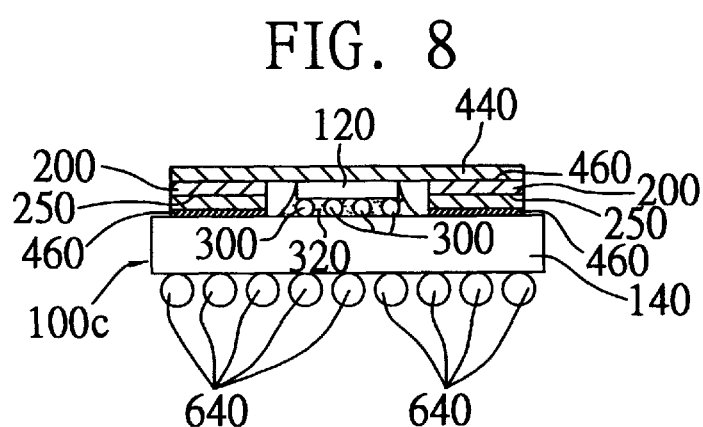
FIG. 8 is a schematic sectional diagram of a fourth preferred embodiment of the semiconductor package structure of the invention.

FIG. 8 is a schematic sectional diagram of the fourth preferred embodiment of the semiconductor package structure of the invention. As shown, this embodiment is characterized in that a lid 440 is mounted by means of an adhesive 460 over the top opening of the centrally-hollowed portion 240 of the stiffener 200 for sealing the semiconductor chip 120.

Fifth Preferred Embodiment

Figure 9:
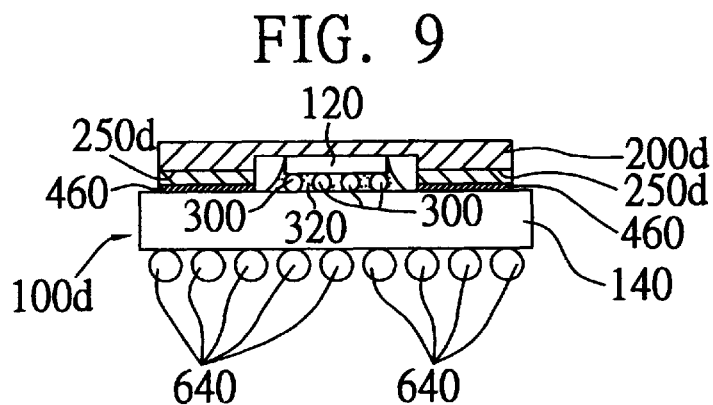
FIG. 9 a is schematic sectional diagram of a fifth preferred embodiment of the semiconductor package structure of the invention.

FIG. 9 is a schematic sectional diagram of the fifth preferred embodiment of the semiconductor package structure of the invention. As shown, this embodiment differs from the previous one particularly in that the stiffener 200d is integrally formed with a lid. In the fabrication process, the semiconductor chip 120 is first mounted on the substrate 140; and then, the lidded stiffener 200d is adhered to the substrate 140.

Sixth Preferred Embodiment

Figure 10:
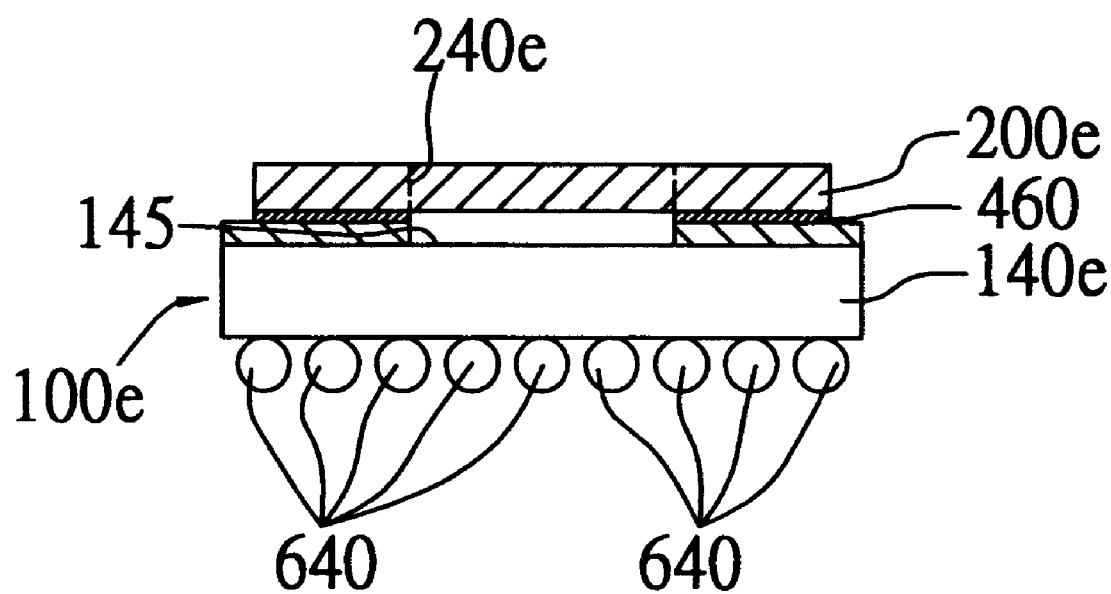
FIG. 10 a is schematic sectional diagram of a sixth preferred embodiment of the semiconductor package structure of the invention.

FIG. 10 is a schematic sectional diagram of a sixth preferred embodiment of the semiconductor package structure of the invention. This embodiment is characterized in that the passage 145 is formed in the substrate 140e, which also allows the injection of cleaning solvent from outside into the gap between the substrate 140e and the stiffener 200e.

The invention has been described using exemplary embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package, comprising the steps of:

preparing a substrate having a front surface and a back surface;

mounting a thermally-conductive stiffener over the front surface of the substrate, wherein the stiffener is formed with a centrally-hollowed portion and at least an outwardly-extending passage connected to the centrally-hollowed portion, allowing a portion of the front surface of the substrate to be exposed to the centrally-hollowed portion of the stiffener;

mounting a semiconductor chip in a flip-chip manner onto the exposed portion of the front surface of the substrate by means of first solder balls through the centrally-hollowed portion of the stiffener, wherein a gap is formed between the semiconductor chip and the substrate;

injecting a cleaning solvent through the outwardly-extending passage of the stiffener into the gap between the semiconductor chip and the substrate;

performing a flip-chip underfill process to form an underfill layer in the gap between the semiconductor chip and the substrate; and implanting a plurality of second solder balls on the back surface of the substrate.

2. A method for fabricating a semiconductor package, comprising the steps of:

preparing a substrate having a front surface and a back surface, the substrate being formed with at least a passage extending from a center of the front surface to an edge side of the substrate;

mounting a thermally-conductive stiffener over the front surface of the substrate, wherein the stiffener is formed with a centrally-hollowed portion connected to the passage of the substrate, and a portion of the front surface of the substrate is exposed to the centrally-hollowed portion of the stiffener;

mounting a semiconductor chip in a flip-chip manner onto the exposed portion of the front surface of the substrate by means of first solder balls through the centrally-hollowed portion of the stiffener, wherein a gap is formed between the semiconductor chip and the substrate;

injecting a cleaning solvent through the passage of the substrate into the gap between the semiconductor chip and the substrate;

performing a flip-chip underfill process to form an underfill layer in the gap between the semiconductor chip and the substrate; and implanting a plurality of second solder balls on the back surface of the substrate.

3. The method of claim 1 or 2, further comprising the step of: accelerating flowing of the cleaning solvent.

4. The method of claim 3, wherein flowing of the cleaning solvent is accelerated through centrifugal means.

5. The method of claim 3, wherein flowing of the cleaning solvent is accelerated through rotating means.

6. The method of claim 3, wherein flowing of the cleaning solvent is accelerated through disturbance means.

7. The method of claim 1 or 2, further comprising the step of:

mounting a lid over the centrally-hollowed portion of the stiffener to seal the semiconductor chip received in the centrally-hollowed portion.

* * * * *